United States Patent
Said

(10) Patent No.: US 11,740,900 B2
(45) Date of Patent: Aug. 29, 2023

(54) ASSOCIATIVELY INDEXED CIRCULAR BUFFER

(71) Applicant: Marvell Rianta Semiconductor ULC, Santa Clara, CA (US)

(72) Inventor: Lawrence Said, Ottawa (CA)

(73) Assignee: Marvell Asia Pte Ltd, Singapore (SG)

( * ) Notice: Subject to any disclaimer, the term of this patent is extended or adjusted under 35 U.S.C. 154(b) by 226 days.

(21) Appl. No.: 17/354,810

(22) Filed: Jun. 22, 2021

(65) Prior Publication Data

US 2022/0405097 A1     Dec. 22, 2022

(51) Int. Cl.
| | |
|---|---|
| *G06F 9/30* | (2018.01) |
| *G06F 5/10* | (2006.01) |
| *G06F 12/02* | (2006.01) |
| *G11C 15/04* | (2006.01) |
| *G06F 5/08* | (2006.01) |

(52) U.S. Cl.
CPC .............. *G06F 9/3004* (2013.01); *G06F 5/10* (2013.01); *G06F 12/0223* (2013.01); *G06F 5/085* (2013.01); *G11C 15/04* (2013.01)

(58) Field of Classification Search
CPC .... G06F 9/3004; G06F 12/0875; G06F 5/085; G06F 5/10; G06F 3/0656; G06F 13/1673; G06F 12/023–0246; G06F 12/0223; G06F 12/06–0692
See application file for complete search history.

(56) References Cited

U.S. PATENT DOCUMENTS

| | | | | |
|---|---|---|---|---|
| 6,078,683 | A * | 6/2000 | Denison | G07D 7/17 382/156 |
| 8,806,154 | B1 * | 8/2014 | Gupta | G06F 3/0689 711/170 |
| 2009/0125697 | A1 * | 5/2009 | Seo | G06F 12/023 711/171 |
| 2013/0031142 | A1 * | 1/2013 | Wester | G06F 16/21 707/802 |
| 2013/0339975 | A1 * | 12/2013 | Busaba | G06F 9/44 718/104 |
| 2014/0075144 | A1 * | 3/2014 | Sanders | G06F 5/10 711/170 |
| 2014/0281417 | A1 * | 9/2014 | Peters | G06F 7/32 712/220 |
| 2015/0169237 | A1 * | 6/2015 | Ioannou | G06F 12/0246 711/103 |
| 2019/0042410 | A1 * | 2/2019 | Gould | G06F 9/5016 |
| 2021/0352023 | A1 * | 11/2021 | Syrivelis | G06F 13/36 |
| 2021/0365206 | A1 * | 11/2021 | Liu | G06F 3/0644 |

FOREIGN PATENT DOCUMENTS

GB           2372679 A *  8/2002  ............. H04L 29/06

\* cited by examiner

*Primary Examiner* — William B Partridge

(57) ABSTRACT

Some embodiments of the present disclosure provide an associatively indexed circular buffer (ACB). The ACB may be viewed as a dynamically allocatable memory structure that offers in-order data access (say, first-in-first-out, or "FIFO") or random order data access at a fixed, relatively low latency. The ACB includes a data store of non-contiguous storage. To manage the pushing of data to, and popping data from, the data store, the ACB includes a contiguous pointer generator, a content addressable memory (CAM) and a free pool.

18 Claims, 8 Drawing Sheets

ASSOCIATIVELY INDEXED CIRCULAR BUFFER

TECHNICAL FIELD

The present disclosure relates, generally, to computer memory and, in particular embodiments, to an associatively indexed circular buffer.

BACKGROUND

Data may be arranged to arrive at a memory structure from a plurality of channels. The data, generally, does not arrive at the memory structure at the same rate on every channel. Accordingly, it may be shown to be useful to be aware of the maximum rate among the rates in the plurality of channels. To be able to handle the maximum rate from any one of the channels, the memory structure may be arranged to include a single contiguous memory assigned to each channel. The capacity of all of the contiguous memories may be arranged to be the same, with the capacity being based on the maximum rate. Notably, it may appear wasteful to allocate contiguous memory for each channel of a plurality of channels when only the equivalent of the capacity of one of the contiguous memories will ever be used.

SUMMARY

Aspects of the present application relate to an associatively indexed circular buffer (ACB). The ACB may be viewed as a dynamically allocatable memory structure that offers in-order data access (say, first-in-first-out, or "FIFO") or random order data access at a fixed, relatively low latency. The ACB includes a data store of non-contiguous storage. To manage the pushing of data to, and popping data from, the data store, the ACB includes a contiguous pointer generator, a content addressable memory (CAM) and a free pool.

By collapsing contiguous pointers into the CAM, logarithmic growth may be shown to be allowed, rather than linear growth. The use of contiguous pointers, as managed by the contiguous pointer generator, may be shown to allow for fixed latency random access. The use of a zero read latency circular buffer for the free-pool may be shown to allow for a scalable architecture for zero read latency. Overall the ACB may be shown to operate with minimum overhead and be scalable.

According to an aspect of the present disclosure, there is provided a method of carrying out a push operation at an associatively indexed circular buffer (ACB), the ACB including a data store, a contiguous pointer generator, a content addressable memory (CAM) and a free pool. The method includes receiving a push operation instruction with data that is to be pushed, obtaining, from the free pool, a data-store address to a physical memory location in the data-store, obtaining, from the contiguous pointer generator, a contiguous pointer, writing the contiguous pointer to the CAM at a CAM address corresponding to the data-store address and writing, in the data store at the data-store address, the data that is to be pushed.

According to an aspect of the present disclosure, there is provided an associatively indexed circular buffer (ACB). The ACB includes a data store, a contiguous pointer generator, a content addressable memory (CAM), a free pool and a control element. The control element is configured to receive a push operation instruction with data that is to be pushed, obtain, from the free pool, a data-store address to a physical memory location in the data-store, obtain, from the contiguous pointer generator, a contiguous pointer, write the contiguous pointer to the CAM at a CAM address corresponding to the data-store address and write, in the data store at the data-store address, the data that is to be pushed.

According to an aspect of the present disclosure, there is provided a method of carrying out a pop operation at an associatively indexed circular buffer (ACB), the ACB including a data store, a contiguous pointer generator, a cam and a free pool. The method includes receiving a pop operation instruction, obtaining, from the contiguous pointer generator, a contiguous pointer, providing, to the content addressable memory (CAM), the contiguous pointer, receiving, from the CAM, a data-store address, reading, from the data store at the data-store address, data and providing the data in answer to the pop operation instruction.

According to an aspect of the present disclosure, there is provided an associatively indexed circular buffer (ACB). The ACB includes a data store, a contiguous pointer generator, a content addressable memory (CAM), a free pool and a control element. The control element is configured to receive a pop operation instruction, obtain, from the contiguous pointer generator, a contiguous pointer, provide, to the content addressable memory (CAM), the contiguous pointer, receive, from the CAM, a data-store address, read, from the data store at the data-store address, data and provide the data in answer to the pop operation instruction.

BRIEF DESCRIPTION OF THE DRAWINGS

For a more complete understanding of the present embodiments, and the advantages thereof, reference is now made, by way of example, to the following descriptions taken in conjunction with the accompanying drawings, in which.

DETAILED DESCRIPTION OF ILLUSTRATIVE EMBODIMENTS

For illustrative purposes, specific example embodiments will now be explained in greater detail in conjunction with the figures.

The embodiments set forth herein represent information sufficient to practice the claimed subject matter and illustrate ways of practicing such subject matter. Upon reading the following description in light of the accompanying figures, those of skill in the art will understand the concepts of the claimed subject matter and will recognize applications of these concepts not particularly addressed herein. It should be understood that these concepts and applications fall within the scope of the disclosure and the accompanying claims.

Moreover, it will be appreciated that any module, component, or device disclosed herein that executes instructions may include, or otherwise have access to, a non-transitory computer/processor readable storage medium or media for storage of information, such as computer/processor readable instructions, data structures, program modules and/or other data. A non-exhaustive list of examples of non-transitory computer/processor readable storage media includes magnetic cassettes, magnetic tape, magnetic disk storage or other magnetic storage devices, optical disks such as compact disc read-only memory (CD-ROM), digital video discs or digital versatile discs (i.e., DVDs), Blu-ray Disc™, or other optical storage, volatile and non-volatile, removable and non-removable media implemented in any method or technology, random-access memory (RAM), read-only memory (ROM), electrically erasable programmable read-only memory (EE-PROM), flash memory or other memory technology. Any such non-transitory computer/processor storage media may be part of a device or accessible or connectable thereto. Computer/processor readable/executable instructions to implement an application or module described herein may be stored or otherwise held by such non-transitory computer/processor readable storage media.

Figure 1:
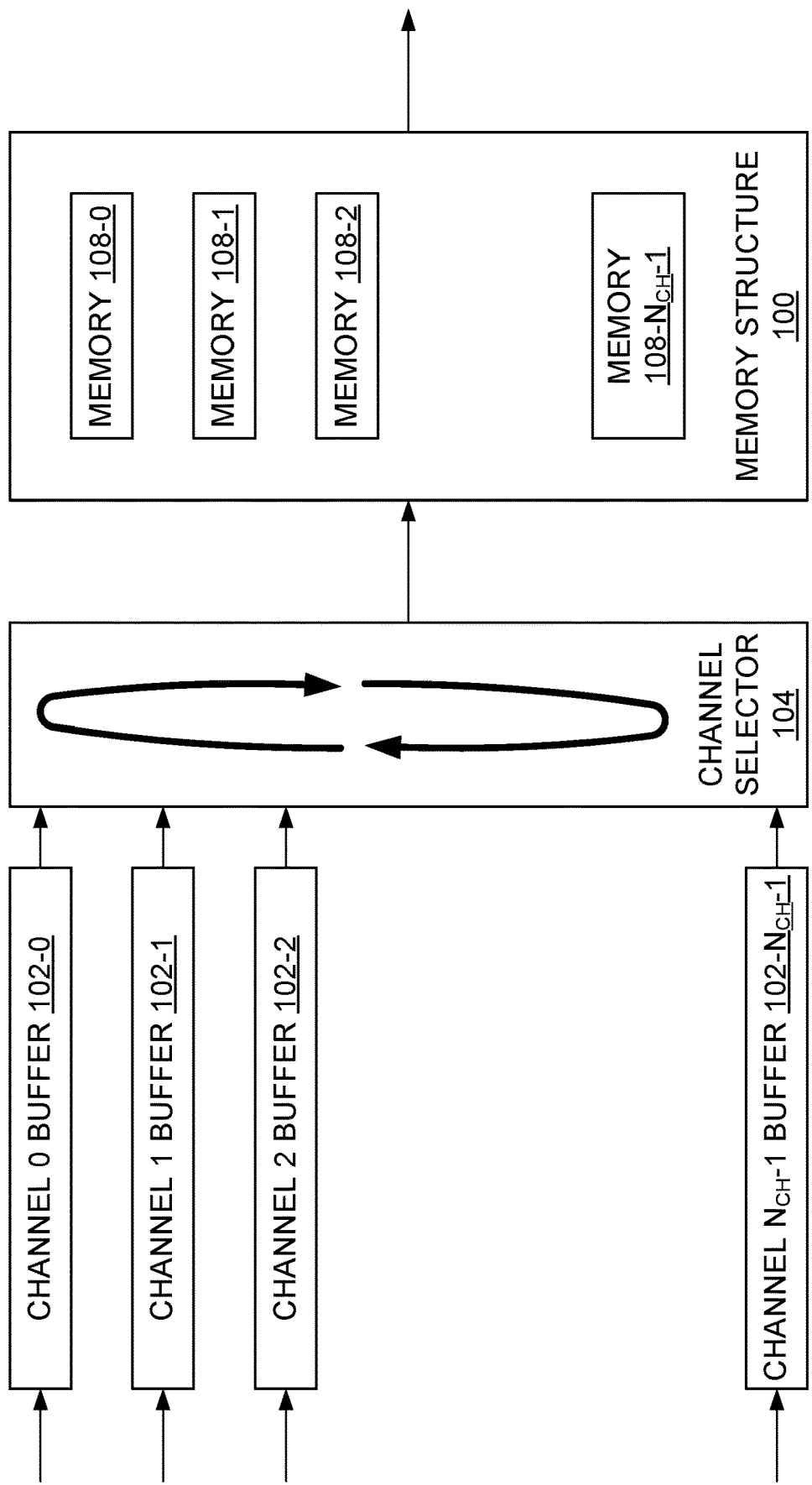
FIG. 1 illustrates, as a block diagram, a known arrangement that allows for access, by multiple channels, to a memory structure.

FIG. 1 illustrates, as a block diagram, an arrangement that allows for access, by multiple channels, to a memory structure 100. In particular, FIG. 1 illustrates a buffer 102 for each of $N_{CH}$ channels: a channel 0 buffer 102-0; a channel 1 buffer 102-1; a channel 2 buffer 102-2; and a channel $N_{CH}$-1 buffer 102-$N_{CH}$-1. Output from each buffer 102 may be selected by a channel selector 104 for presentation to the memory structure 100. The rate at which traffic arrives at each buffer may be distinct. For example, consider that traffic arrives at the channel 0 buffer 102-0 at a rate of 50 Gb/s, arrives at the channel 1 buffer 102-1 at a rate of 50 Gb/s, arrives at the channel 2 buffer 102-2 at a rate of 25 Gb/s and arrives at the channel $N_{CH}$-1 buffer 102-$N_{CH}$-1 at a rate of 100 Gb/s. Since the maximum among these rates is 100 Gb/s, the communication from the channel selector 104 to the memory structure 100 may be arranged to be 100 Gb/s. To be able to handle 100 Gb/s from any one of $N_{CH}$ channels, the memory structure may be arranged to include a memory portion 108 assigned to each channel: a channel 0 memory portion 108-0; a channel 1 memory portion 108-1; a channel 2 memory portion 108-2; and a channel $N_{CH}$-1 memory portion 108-$N_{CH}$-1. Each memory portion 108 is configured to be the same size.

While it is recognized that, based on a maximum rate at the input to the memory structure 100, there will never be a need for more storage than the equivalent of one of the memory portions 108, a memory portion 108 is allocated for each channel because it is not known which channel will require the maximum storage at any given time. Indeed, it may appear wasteful to allocate memory for $N_{CH}$ memory portions 108 when only the equivalent of one of the memory portions 108 will ever be used.

Figure 2:
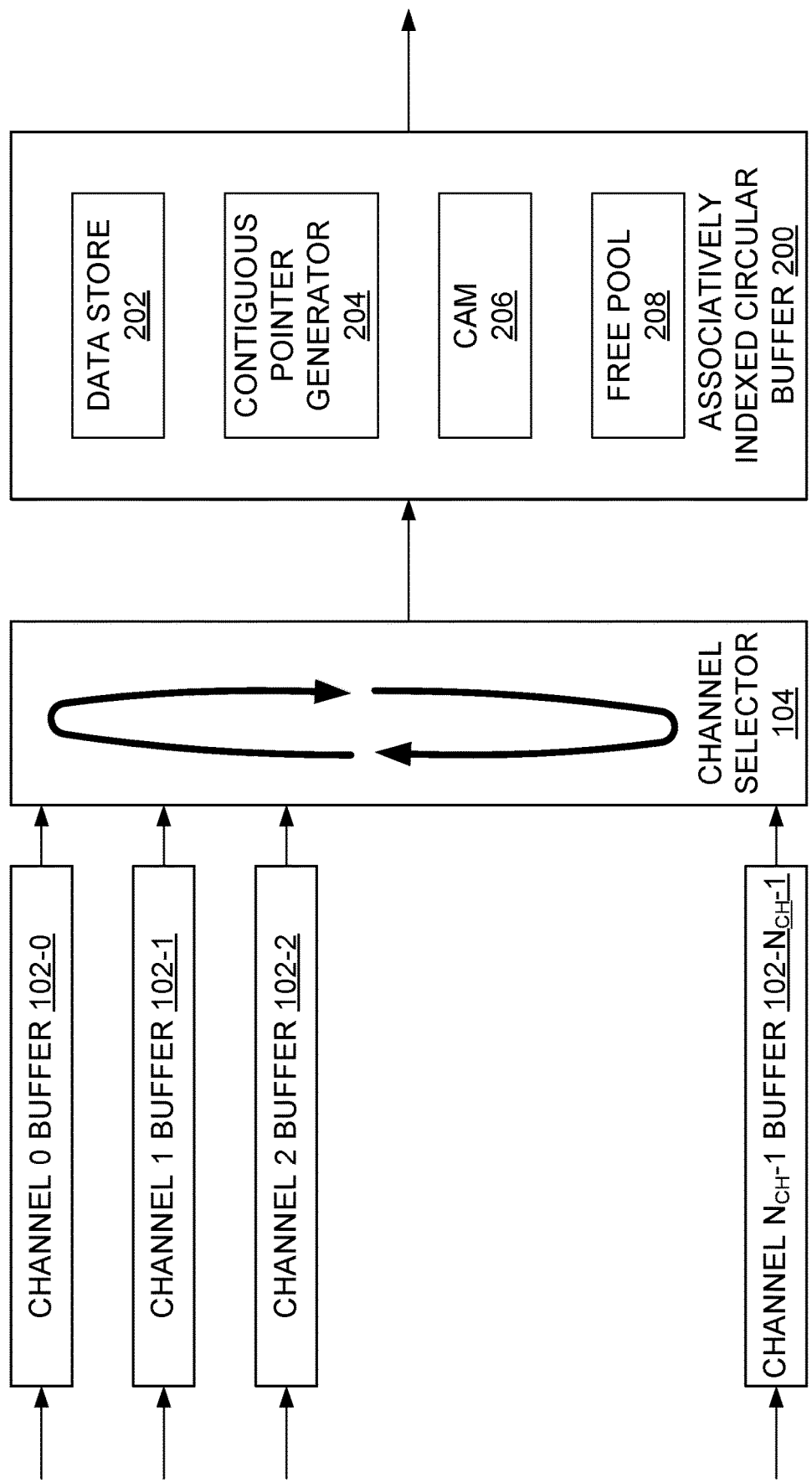
FIG. 2 illustrates, in a block diagram, an arrangement that allows for access, by multiple channels, to an associatively indexed circular buffer (ACB), in accordance with aspects of the present application, the components of the ACB include a data store, a contiguous pointer generator, a content addressable memory and a free pool.

FIG. 2 illustrates, in a block diagram, the channel buffers 102 and the channel selector 104 familiar from FIG. 1. In FIG. 2, an associatively indexed circular buffer (ACB) 200 is inserted in place of the memory structure 100 of FIG. 1, in accordance with aspects of the present application. The ACB 200 includes a data store 202 that is representative of a non-contiguous storage. The ACB 200 also includes a contiguous pointer generator 204, a content addressable memory (CAM) 206 and a free pool 208. Content-addressable memory is a type of storage structure that allows searching by content as opposed to searching by address. Such memory structures are used in diverse applications ranging from branch prediction in a processor to complex pattern recognition. The CAM 206 may be implemented as a flop-based memory. Alternatively, the CAM 206 may be implemented as a vendor macro. Further alternatively, the CAM 206 may be implemented as a cascaded multi-stage flop-based memory.

As illustrated in FIG. 2, the ACB 200 may be accessed for push operations (write operations) by $N_{CH}$ channels, including a push operation by a channel 0, a push operation by a channel 1, through to a push operation by a channel $N_{CH}$-1. Output from the ACB 200 may be representative of a pop operation (read operation) by the same $N_{CH}$ channels, including a pop operation by a channel 0, a pop operation by a channel 1, through to a pop operation by a channel $N_{CH}$-1.

It is understood that, when the data store 202 has been defined as having a finite depth, D, there are D physical memory locations in the data store 202. Each one of the D physical memory locations is associated with a corresponding physical data-store address. While there may exists $N_{CH}*D$ contiguous pointers 302, it should be understood that there can only ever be data stored in D physical memory locations at any given time. Accordingly, there can only be D of the contiguous pointers in use at any given time. The management of a correspondence between the $N_{CH}*D$ contiguous pointers and the D physical data-store addresses in the data store 202 may be maintained by the contiguous pointer generator 204.

Figure 3:
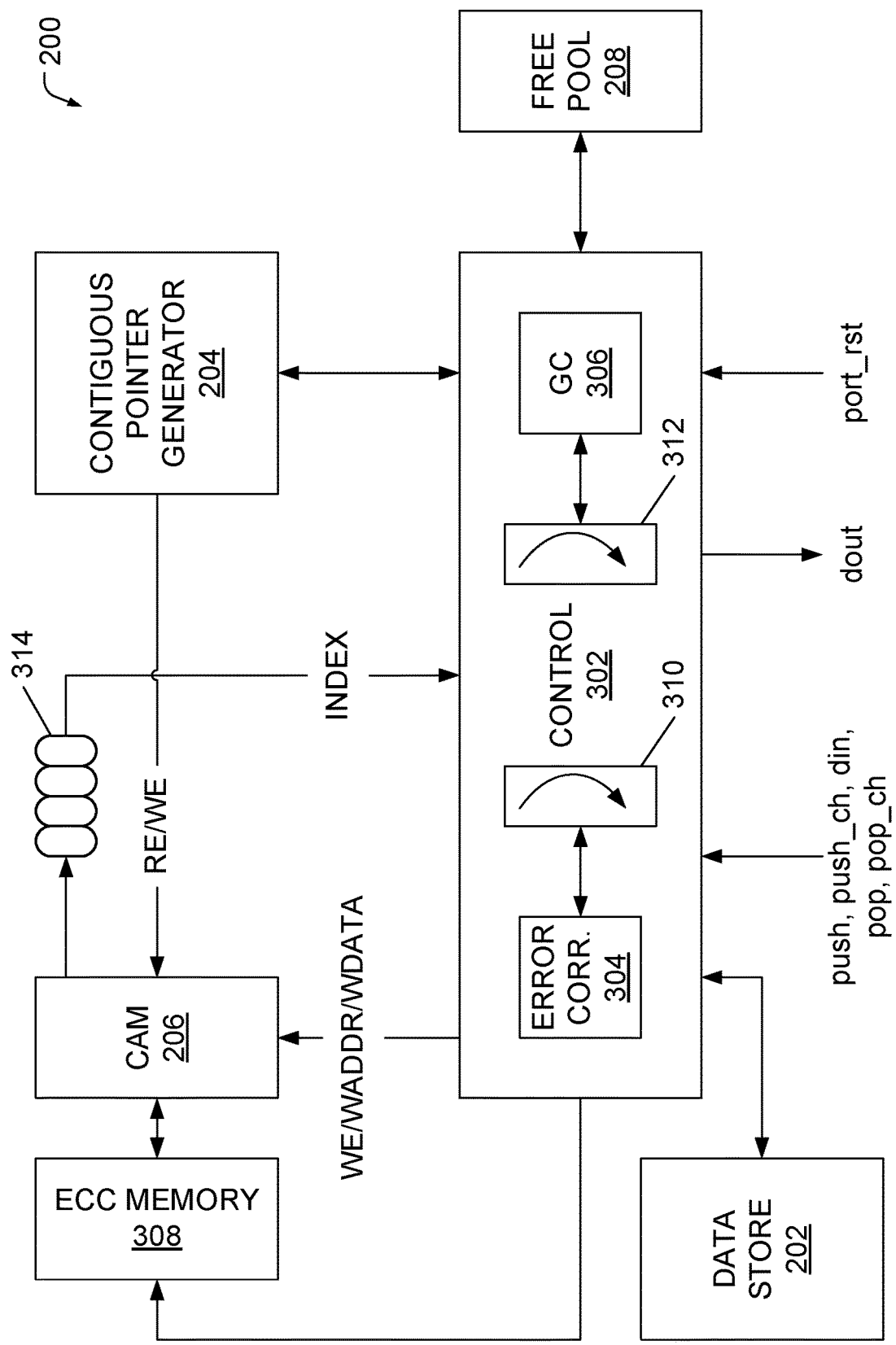
FIG. 3 illustrates, as a block diagram, the ACB of FIG. 2 with more detail than is presented in FIG. 2, in accordance with aspects of the present application.

FIG. 3 illustrates, as a block diagram with more detail than is presented in FIG. 2, the ACB 200. Elements of the ACB 200 illustrated in FIG. 3 that should be familiar from FIG. 2 include the data store 202, the contiguous pointer generator 204, the CAM 206 and the free pool 208. Additional elements are illustrated in FIG. 3 connected to the familiar elements. A control element 302, for instance, is connected to the data store 202, the contiguous pointer generator 204 and the free pool 208. The CAM 206 is illustrated, in FIG. 3, as having bidirectional communication with an error correction code (ECC) memory 308. Additionally, the CAM 206 may communicate indices to the control element 302 via a pipeline delay 314. The control element 302 is illustrated as including an error correction element 304 in communication with a first round-robin arbiter 310. The error correction element 304 is illustrated in communication with the ECC memory 308. The control element 302 is further illustrated as including a garbage collection (GC) element 306 in communication with a second round-robin arbiter 312.

The ECC memory 308, the error correction element 304 and the first round-robin arbiter 310 may be implemented when the ACB 200 is to be compiled with scrubbing support.

The pipeline delay 314 may be implemented when the ACB 200 is to be compiled with a desired memory read latency (MRL) that is greater than 0. Also, when the ACB 200 is to be compiled with a desired MRL that is greater than 0, the free pool 208 may be implemented as a RAM FIFO.

When the ACB 200 is to be implemented with a desired zero read latency (ZRL), it is proposed to implement the free-pool 208 using a ZRL FIFO 400 (see FIG. 4) and to make the CAM 206 flop-based.

Figure 4:
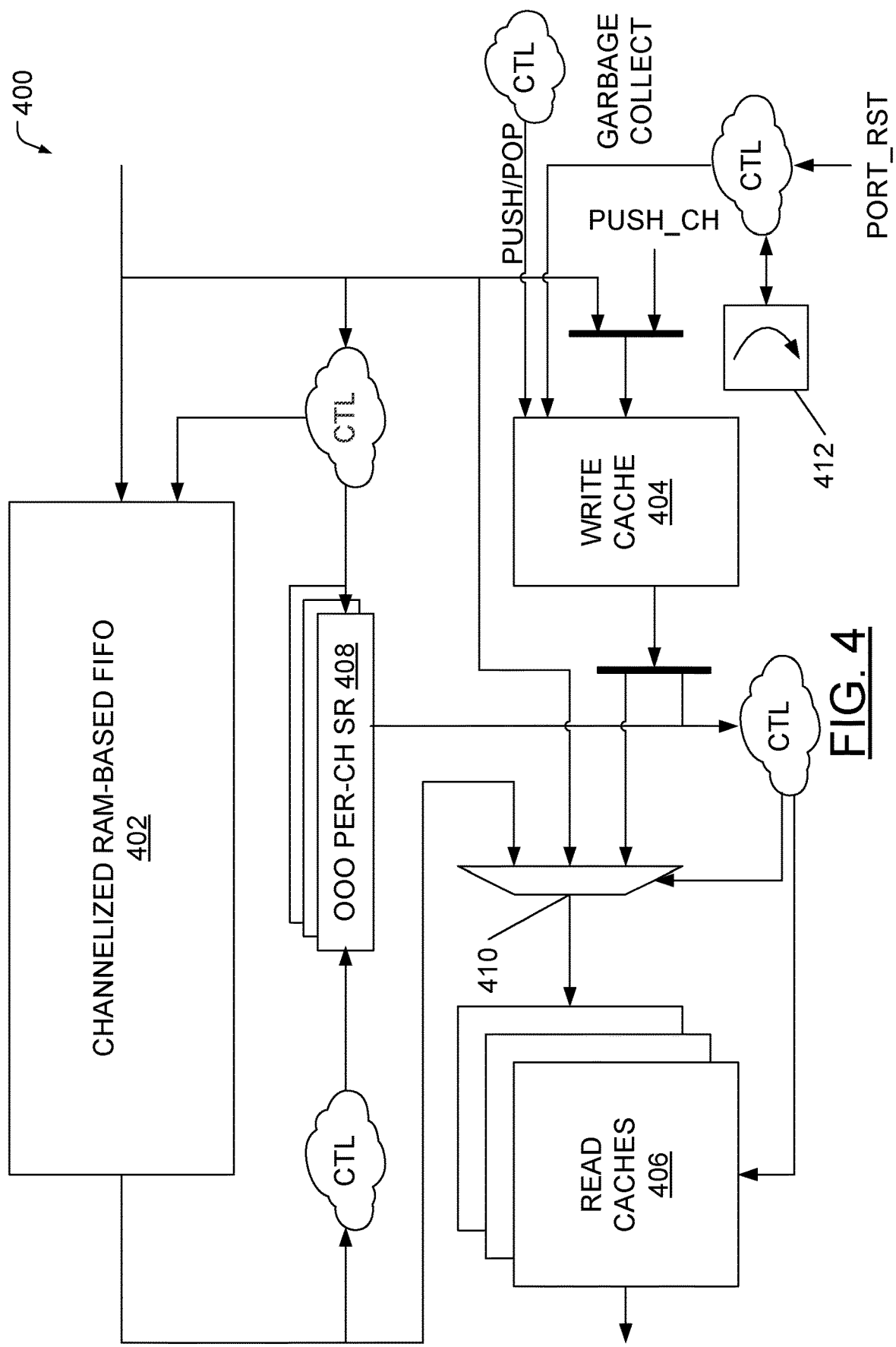
FIG. 4 illustrates, in a block diagram, a zero read latency first-in-first-out (FIFO) memory structure, in accordance with aspects of the present application.

The ZRL FIFO 400 is a FIFO that interfaces to a memory but hides its MRL through the use of caches. The purpose of the ZRL FIFO 400 is to create a zero read latency FIFO, while keeping the number of flops to a minimum. FIG. 4 illustrates, as a block diagram, an example of the ZRL FIFO 400. From a high level, caches may be employed to maintain the most recent data, such that the most recent data can be accessed immediately. The caches are illustrated in FIG. 4 as a write cache 404 and a plurality of read caches 406. Control logic dictates which of the caches 404, 406 are pushed to, or popped from, at any given time. The ZRL FIFO 400 of FIG. 4 further includes a channelized RAM-based FIFO 402 and an out-of-order (OOO) per-channel shift register (SR) 408.

In overview, aspects of the present application relate to sharing a fixed amount of storage across several channels given that the overall bandwidth across all channels is fixed, but also given that the overall bandwidth could be on any channel at any given time or shared across all of the channels. The ACB 200 may be shown to act as a dynamically allocatable memory structure. When the depth of the ACB 200 is D, the ACB 200 may maintain, in a FIFO-like structure (the free pool 208), a pool of available physical data-store addresses in the range [0x0, . . . , 0xD−1].

In operation, data may be pushed to the ACB 200 by a plurality of channels, in various push operations under the control of the channel selector 104. As data is pushed to the ACB 200 in the various push operations, physical data-store addresses may be removed from the free pool 208 and allocated for the storage, in the data store 202, of the data received as part of the push operations. Similarly, as data is popped from the ACB 200 in various pop operations, physical data-store addresses may be returned to the free pool 208 as freed up by the pop operations.

It is notable that the data store 202 is representative of non-contiguous data storage. Consequently, it may be shown that, under typical circumstances, there would be no easy way to access specific data that has been written to the data store 202, since, over time, based on the random arrivals of push and pop across different channels, the physical data-store addresses are arbitrarily allocated.

The contiguous pointer generator 204 may be shown to solve the problem of accessing data that has been written to the data store 202 on the basis of physical data-store addresses that have been pseudo-randomly allocated. The contiguous pointer generator 204 may be implemented as a channelized entity that provides contiguous pointers in the range [0, . . . , D−1], on a per channel basis. The contiguous pointer generator 204 may be considered to cycle through a pool of contiguous pointers in the range [0, . . . , D*$N_{CH}$−1], where $N_{CH}$ is the number of channels.

Each channel has its own contiguous address range [0, . . . , D−1]. If the CH# is concatenated with that contiguous address range, the result is a pool of unique contiguous addresses in the range [0, . . . , D*$N_{CH}$−1].

channel 0 has 0: D−1→after concatenation→0: D−1
channel 1 has 0: D−1→after concatenation→1*D:1*D+ D−1
channel 2 has 0: D−1→after concatenation→2*D: 2*D+ D−1
. . .
channel i has 0: D−1→after concatenation→i*D: i*D+ D−1

A nomenclature {a, b} is used herein as a shorthand for concatenation. The above transformation may be expressed simply as {CH_NUMBER, CH_ADDR} where CH_ADDR is in the range [0, . . . , D−1] and CH_NUMBER is in the range [0, . . . , $N_{CH}$−1].

On a push (write) to the ACB 200, a physical data-store address, ADDRESS_A, is popped from the free-pool 208 and a contiguous pointer, B, is obtained from the contiguous pointer generator 204. Since, the physical data-store address ADDRESS_A is to be associated with the contiguous pointer B, the next step is to store, somewhere, the association between the physical data-store address ADDRESS_A and the contiguous pointer B.

According to aspects of the present application, the CAM 206 may be used to store an association between a given contiguous pointer and a physical data-store address. The CAM 206 may be understood to operate on the basis of a key and an index. For the purposes of the present application, the key to the CAM 206 is the contiguous pointer and the index is the physical data-store address.

Figure 5:
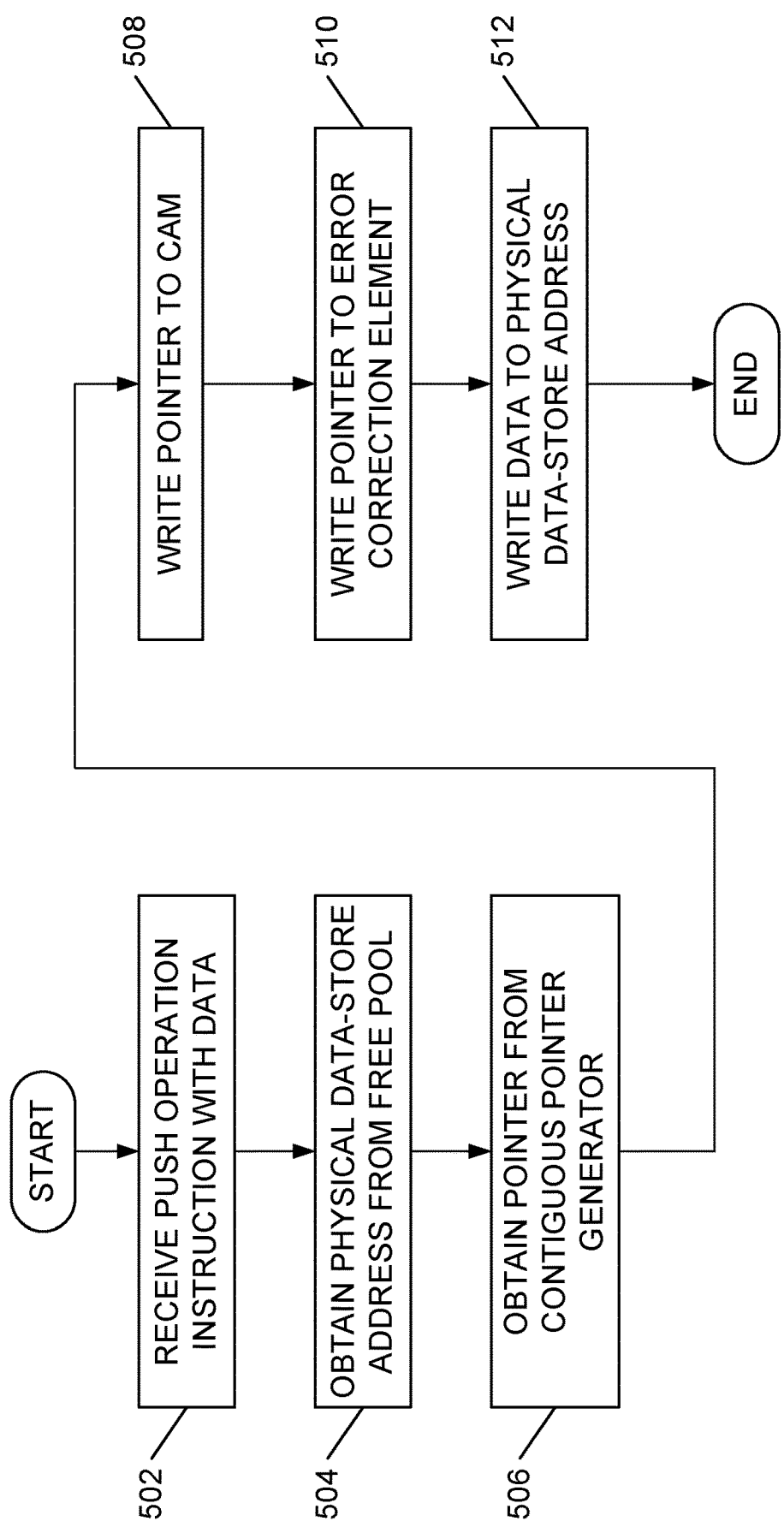
FIG. 5 illustrates example steps in a method of carrying out a push operation to the ACB of FIG. 2, in accordance with aspects of the present application.

FIG. 5 illustrates example steps in a method of carrying out a push operation to the ACB 200. The control element 302 (see FIG. 3) initially receives (step 502) a push operation instruction with some data that is to be pushed. The control element 302 responds by obtaining (step 504) a physical data-store address from the free pool 208. The control element 302 obtains (step 506) a contiguous pointer from the contiguous pointer generator 204. The control element 302 writes (step 508), using a dedicated write interface (labelled "WE/WADDR/WDATA" in FIG. 3), the obtained contiguous pointer to the CAM 206 at an address in the CAM 206 that corresponds to the obtained physical data-store address. In conjunction with writing (step 508) the obtained contiguous pointer to the CAM 206, the control element 302 writes (step 510) the obtained contiguous pointer to the error correction element 304. Responsively, the error correction element 304 generates parity bits and writes the parity bits to the ECC memory 308. The control element 302 may then write (step 512) the data to be pushed in the data store 202 at the physical data-store address.

It is notable that an interface between the control element 302 and the free pool 208 may have a data bus with a predetermined width. Furthermore, the data bus may be much wider than the size of a typical physical data-store address that is obtained from the free pool 208 by the control element 302 (in step 504). The free pool 208 may, accordingly, gang (concatenate) together multiple physical data-store addresses responsive to multiple requests for physical data-store addresses. Of course, the control element 302, upon receipt of the ganged together physical data-store addresses acts to separate out the individual physical data-store addresses. This ganging together, by the free pool 208, of multiple physical data-store addresses may be shown to lead to more efficient utilization of the interface between the control element 302 and the free pool 208.

Figure 6:
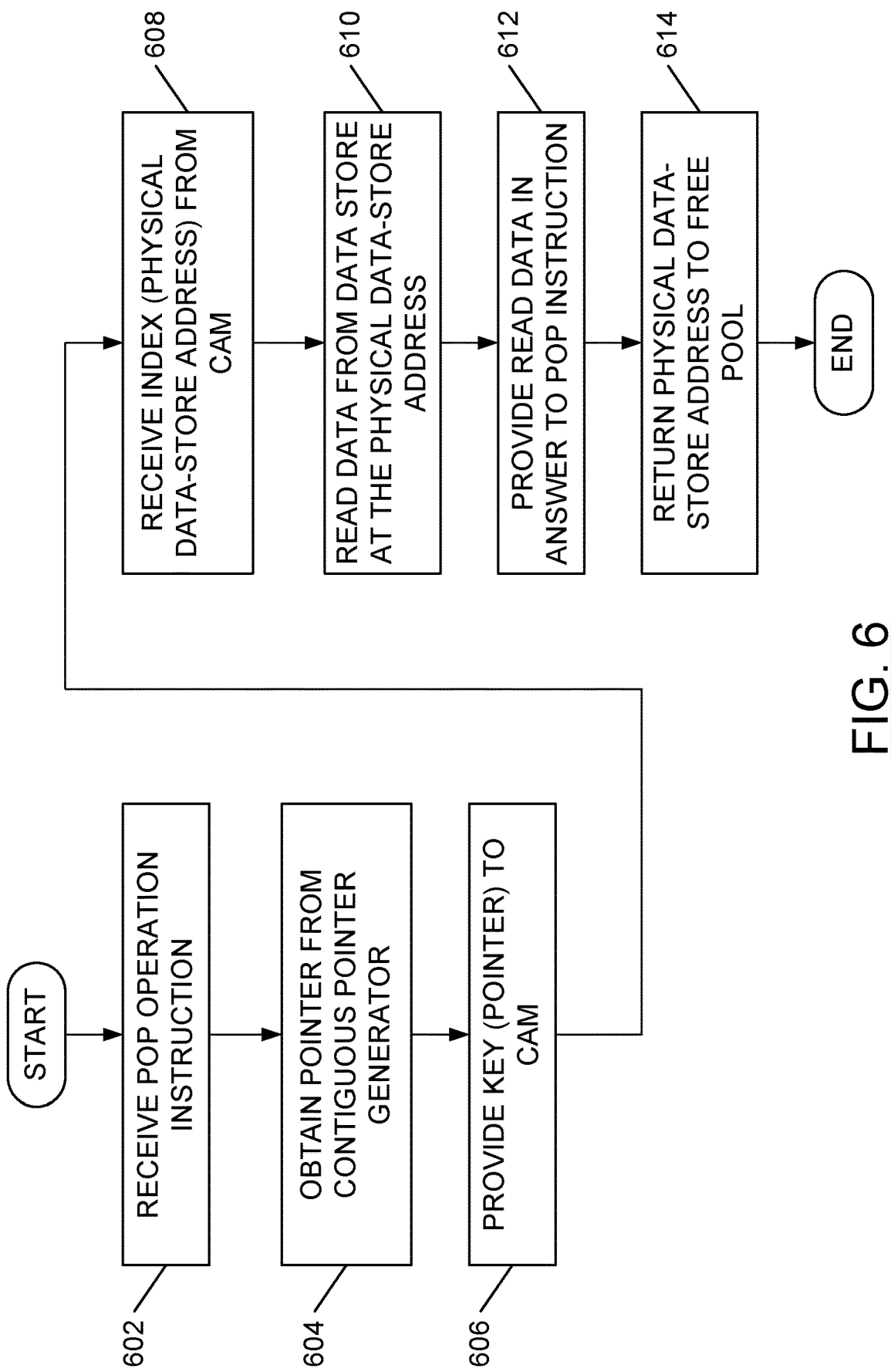
FIG. 6 illustrates example steps in a method of carrying out a pop operation from the ACB of FIG. 2, in accordance with aspects of the present application.

FIG. 6 illustrates example steps in a method of carrying out a pop operation from the ACB 200. The control element 302 initially receives (step 602) a pop operation instruction. The control element 302 responds by obtaining (step 604) a contiguous pointer from the contiguous pointer generator 204. The contiguous pointer generator 204 is understood to generate a next read contiguous pointer. The control element 302 provides (step 606) the obtained read contiguous pointer to the CAM 206 as a key. The control element 302 receives (step 608), from the CAM 206, the index associated with the key. That is, the control element 302 receives (step 608), from the CAM 206, the physical data-store address associated with the contiguous pointer. The control element 302 reads (step 610) data from the data store 202 at the physical data-store address received in step 608. As a part of reading (step 610) the data from the data store 202, the data may be purged from the data store 202 to, thereby, release the memory space for future write operations. The control element 302 may then provide (step 612) the read data in answer to the pop instruction. Subsequent to the completion of the pop operation, the control element 302 may return (step 614) the physical data-store address to the free pool 208.

When returning (step 614) the physical data-store address to the free pool 208, the control element 302 may add the physical data-store address to a local buffer (not shown). The control element 302 may wait until a predetermined number, say two, of physical data-store addresses have been added to the buffer before ganging (concatenating) together the multiple physical data-store addresses and transferring the ganged together physical data-store addresses to the free pool 208. This ganging together of multiple physical data-store addresses may be shown to lead to more efficient utilization of the interface between the control element 302 and the free pool 208.

The ACB 200 may be configured allow access for a "peek" at the data in any physical data-store address in the data store 202. The steps in a method of carrying out a peek operation may be expected to map very closely to the example steps illustrated, in FIG. 6, for a method of carrying out a pop operation. A method of carrying out a peek operation is expected to differ from the method of carrying out a pop operation in that, as a part of reading (step 610) the data from the data store 202, the data will not be purged from the data store 202. Furthermore, the control element 302, upon carrying out a peek operation, will not return (step 614) the physical data-store address to the free pool 208.

Figure 7:
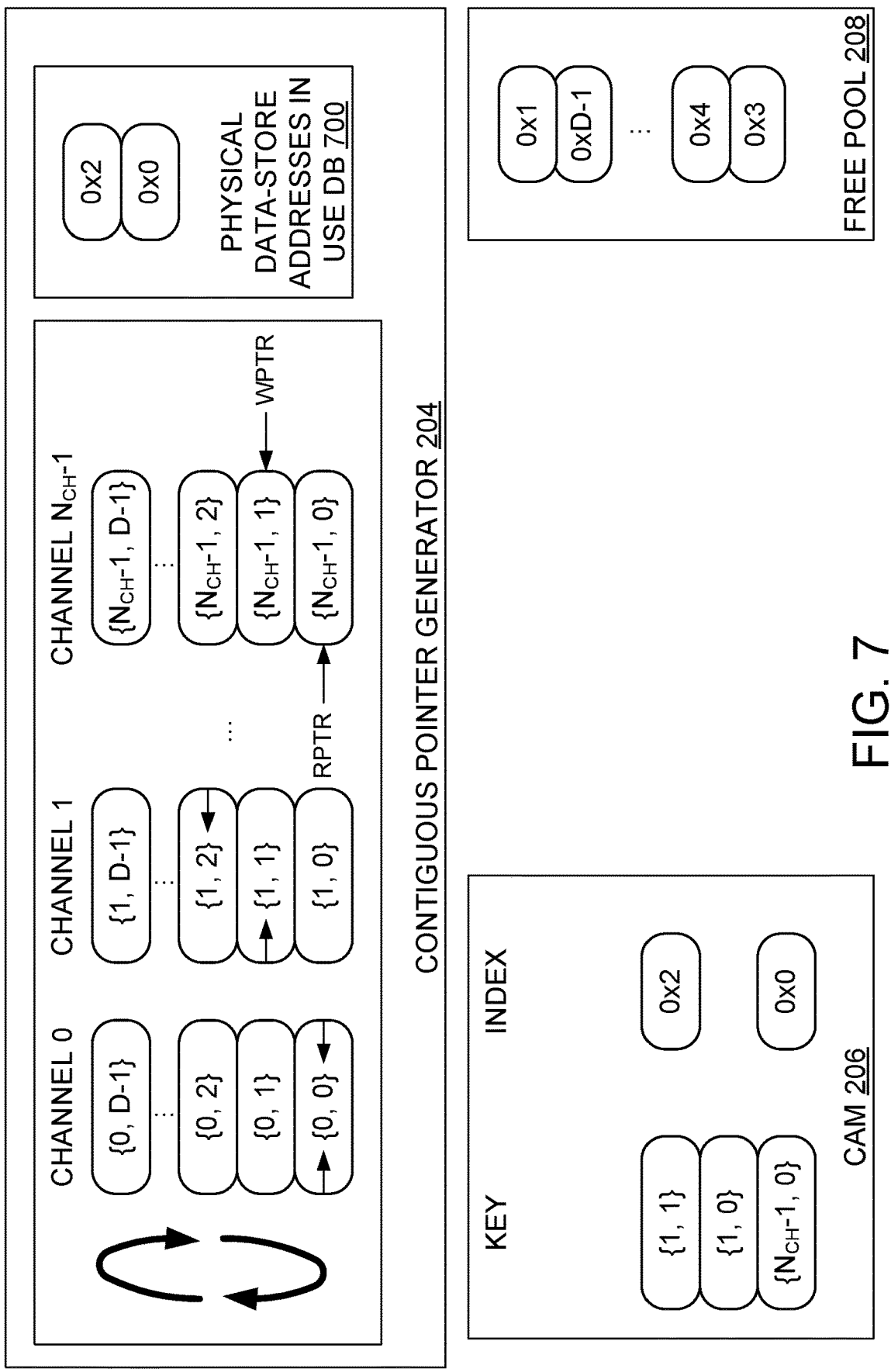
FIG. 7 illustrates a snapshot of the ACB of FIG. 2 after three push operations and one pop operation, in accordance with aspects of the present application.

FIG. 7 illustrates a snapshot of the ACB 200 after three push operations and one pop operation. Channel 1 has pushed twice and popped once and channel $N_{CH}$-1 has pushed once. It follows that the free pool 208 contains D−2 addresses, since physical data-store address 0x0 (corresponding to contiguous pointer $\{N_{CH}-1,0\}$) and physical data-store address 0x2 (corresponding to contiguous pointer $\{1,1\}$) are in use. The contiguous pointer generator 204 may maintain a database 600 in which is stored those physical data-store addresses that are in use. As a result of the pop operation, physical data-store address 0x1 has been returned to the free pool 208.

If there were to be a pop operation related to channel 1, it may be expected that the control element 302 would obtain (step 604), from the contiguous pointer generator 204, contiguous pointer $\{1,1\}$. Responsive to the control element 302 providing (step 606), to the CAM 206, the contiguous pointer $\{1,1\}$ as a key, the CAM 206 may be expected to return, via the pipeline delay 314, the index (physical data-store address 0x2) that is associated with the provided key.

For each channel, the contiguous pointers referenced in the data store 202 wrap at value D and physical data-store addresses are recycled through the free pool 208.

Fixed latency for pushes and pops may be considered to be established as a result of the contiguous pointer generator 204. Unlike a linked-list approach for dynamic memory, there is no need to query the memories to determine the location of the next data to be popped (or pushed). Instead, the contiguous pointer generator 204 manages the current read/write contiguous pointer and the CAM 206 provides the mapping to the physical data-store addresses.

It is possible to access the $N^{th}$ stored element for any given channel in the data store 202 by obtaining (step 604), from the contiguous pointer generator 204, a contiguous pointer to the $N^{th}$ stored element for the given channel. The contiguous pointer generator 204 may be expected to add N to the current read contiguous pointer for the given channel. Upon obtaining (step 604) the read contiguous pointer, the control element 302 may provide (step 606) the read contiguous pointer, as a key, to the CAM 206 and receive (step 608) the physical data-store address of the $N^{th}$ stored element as an index associated with the key.

At any time, a given channel may have data in the data store 202. Under some circumstances, the given channel may be reset. Responsive to the resetting of the given channel, an operation may be initiated wherein the physical data-store addresses corresponding to the data in the data store 202 for the given channel are returned to the free pool 208. This operation is referred to as garbage collection. The control element 302 may be configured to wait for idle cycles. At an idle cycle, the GC element 306 may trigger pop operations from the data store 202 for the given channel for which the garbage collection operation has been initiated. The GC element 306 may repeat the pop operation until all in-use physical data-store addresses for the given channel have been moved from the in-use database 600 to the free pool 208. If several channels are to be garbage collecting simultaneously, the GC element 306 may only act upon a single channel at any given time. Hence, the second round-robin arbiter 312 may be employed to pick the single channel that is to be allowed to subject to active garbage collecting operations by the GC element 306. The entire garbage collecting operation may be shown to use K idle cycles for a given channel, where K is the current number of elements in the data store 202 for the given channel.

The ACB 200 may be configured to maintain error correction code (ECC) parity bits for every entry (key and index) in association with the CAM 206. The ECC parity bits may be updated each time the CAM 206 is written to. Periodically, the control element 302 may scrub a given entry in the CAM 206. Entries eligible for scrubbing are those that were written to, but not read from, for at least T cycles (where T is some programmable value). A scrub operation involves the error correction element 304 reading an entry in the CAM 206, correcting any single-bit errors (or flagging double-bit errors), and then writing back the correct data into the CAM 206. The first round-robin arbiter 310 may be employed to pick the next entry amongst a plurality of entries that are eligible for scrubbing.

Notably, the receipt (step 608), from the CAM 206, of the index associated with a given key may be interrupted by the scrubbing process described hereinbefore. Conveniently, the index that that is received (step 608) from the CAM 206 after the scrubbing process may be considered to be more likely to be correct than the index that that is received (step 608) from the CAM 206 before the scrubbing process.

In operation, the ZRL FIFO 400 of FIG. 4 may be considered to be implemented as a channelized wrapper around a non-zero read latency storage element. Using channelized read-side caches and a single write side cache, the ZRL FIFO 400 can prefetch data from a storage element and provide the prefetched data in order, per channel, with zero read latency.

The operation of the ZRL FIFO 400 is controlled by an internal control that dictates to which cache data is written. The internal control also dictates from which cache data is read.

The read caches 406, of which there are one per channel, may be implemented as simple, flop-based FIFOs that maintain the head at a constant offset in the array. That is, there is no multiplexing needed to access the head.

The write cache 404, of which there is only one across all channels, may be implemented as a flop-based FIFO with the additional ability to access any element within the array (i.e., out of order read).

This ability to access any element within the array allows for a purge of given items in the write cache 404, where the given items belong to channels that are being garbage collected (e.g., after a per-channel reset event). A purge of given items in the write cache 404 may also be carried out responsive to an element in the write cache 404 being blocked by the element at the head (say for a different channel).

The write cache 404 may be configured to contain the data and the associated channel number of an incoming data element. By writing the associated channel number to the write cache 404, rather than making the write cache 404 channelized, it may be shown that it is possible to achieve logarithmic growth (as opposed to linear growth) of the write cache 404 with respect to the number of channels.

While the ZRL FIFO 400 may be configured to interface to any storage element, a combination of the ZRL FIFO 400 and the ACB 200 according to aspects of the present application, may be considered to produce dynamic memory storage with zero read latency.

Notably, the structure of the ACB 220 may be used a model for a data structure for the channelized RAM-based FIFO 402.

Figure 8:
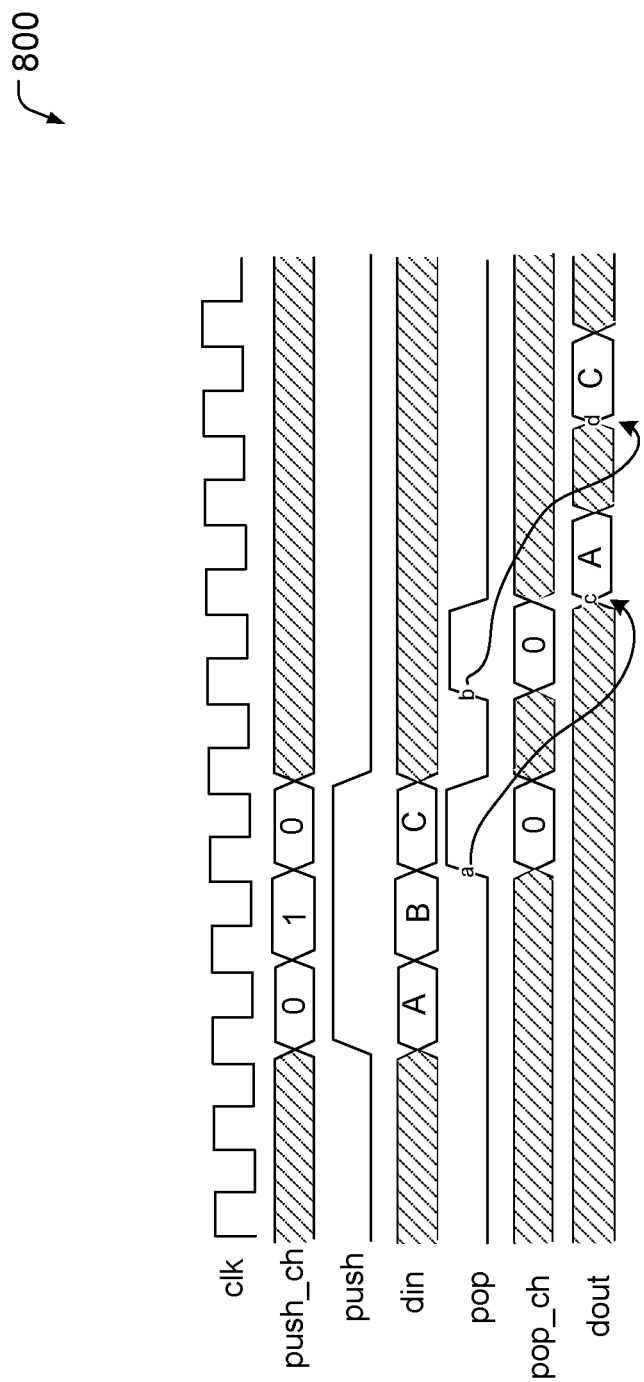
FIG. 8 illustrates a timing diagram with signal traces for signals represented in FIG. 3.

FIG. 8 illustrates a timing diagram 800 with signal traces for signals represented in FIG. 3 as input (push, push_ch, din, pop, pop_ch) to the control element 302 and output (dout) from the control element 302. Since the ACB 200 models a channelized FIFO (i.e., data stored per channel and retrieved in first-in-first-out order per channel), the data (din) is qualified by push for channel push_ch. The din and push_ch signals are expected to be stable for a clock period. When a pop operation is asserted, the ACB 200 will retrieve the data for channel pop_ch and the data (dout) will arrive a number of cycles later (based on the read latency of the ACB.

Conveniently, such a dynamically allocatable memory structure offers data access that may be in-order (FIFO) or random. Furthermore, such a dynamically allocatable memory structure offers data access at a fixed, relatively low latency. Moreover, aspects of the present application may be shown to achieve a dynamically allocatable memory structure with minimum overhead in a scalable manner.

In an alternative embodiment, the contiguous pointer generator 204 may be implemented as a memory, thereby obviating a need for the CAM 206. However, such an approach may be shown to add complexity.

It should be appreciated that one or more steps of the embodiment methods provided herein may be performed by corresponding units or modules. For example, data may be transmitted by a transmitting unit or a transmitting module. Data may be received by a receiving unit or a receiving module. Data may be processed by a processing unit or a processing module. The respective units/modules may be hardware, software, or a combination thereof. For instance, one or more of the units/modules may be an integrated circuit, such as field programmable gate arrays (FPGAs) or application-specific integrated circuits (ASICs). It will be appreciated that where the modules are software, they may be retrieved by a processor, in whole or part as needed, individually or together for processing, in single or multiple instances as required, and that the modules themselves may include instructions for further deployment and instantiation.

Although a combination of features is shown in the illustrated embodiments, not all of them need to be combined to realize the benefits of various embodiments of this disclosure. In other words, a system or method designed according to an embodiment of this disclosure will not necessarily include all of the features shown in any one of the Figures or all of the portions schematically shown in the Figures. Moreover, selected features of one example embodiment may be combined with selected features of other example embodiments.

Although this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method of carrying out a push operation at an associatively indexed circular buffer (ACB), the ACB including a data store, a contiguous pointer generator, a content addressable memory (CAM) and a free pool, the method comprising:
   receiving a push operation instruction with data that is to be pushed;
   obtaining, from the free pool, a data-store address to a physical memory location in the data-store;
   obtaining, from the contiguous pointer generator, a contiguous pointer;
   writing the contiguous pointer to the CAM at a CAM address corresponding to the data-store address; and
   writing, in the data store at the data-store address, the data that is to be pushed.

2. The method of claim 1, further comprising separating the data-store address from among a plurality of data-store addresses obtained from the free pool.

3. An associatively indexed circular buffer (ACB), the ACB comprising:
   a data store;
   a contiguous pointer generator;
   a content addressable memory (CAM);
   a free pool; and
   a control element configured to:
     receive a push operation instruction with data that is to be pushed;
     obtain, from the free pool, a data-store address to a physical memory location in the data-store;
     obtain, from the contiguous pointer generator, a contiguous pointer;
     write the contiguous pointer to the CAM at a CAM address corresponding to the data-store address; and
     write, in the data store at the data-store address, the data that is to be pushed.

4. The ACB of claim 3, wherein the free pool is implemented as a random-access-memory-based first-in-first-out memory structure.

5. The ACB of claim 3, wherein the free pool is implemented as a zero-read-latency-based first-in-first-out memory structure.

6. The ACB of claim 3, wherein the CAM is implemented as a vendor macro.

7. The ACB of claim 3, wherein the CAM is implemented as a cascaded multi-stage flop-based memory.

8. The ACB of claim 3, wherein the control element is further configured to separate the data-store address from among a plurality of data-store addresses obtained from the free pool.

9. A method of carrying out a pop operation at an associatively indexed circular buffer (ACB), the ACB including a data store, a contiguous pointer generator, a cam and a free pool, the method comprising:
  receiving a pop operation instruction;
  obtaining, from the contiguous pointer generator, a contiguous pointer;
  providing, to the content addressable memory (CAM), the contiguous pointer;
  receiving, from the CAM, a data-store address;
  reading, from the data store at the data-store address, data; and
  providing the data in answer to the pop operation instruction.

10. The method of claim 9, further comprising, subsequent to the providing, returning, to the free pool, the data-store address.

11. The method of claim 9, further comprising, subsequent to the reading, purging, from the data store, the data.

12. An associatively indexed circular buffer (ACB), the ACB comprising:
  a data store;
  a contiguous pointer generator;
  a content addressable memory (CAM);
  a free pool; and
  a control element configured to:
    receive a pop operation instruction;
    obtain, from the contiguous pointer generator, a contiguous pointer;
    provide, to the content addressable memory (CAM), the contiguous pointer;
    receive, from the CAM, a data-store address;
    read, from the data store at the data-store address, data; and
    provide the data in answer to the pop operation instruction.

13. The ACB of claim 12, wherein the control element is further configured to return, to the free pool, the data-store address.

14. The ACB of claim 12, wherein the control element is further configured to purge, from the data store, the data.

15. The ACB of claim 12, wherein the free pool is implemented as a random-access-memory-based first-in-first-out memory structure.

16. The ACB of claim 12, wherein the free pool is implemented as a zero-read-latency-based first-in-first-out memory structure.

17. The ACB of claim 12, wherein the CAM is implemented as a vendor macro.

18. The ACB of claim 12, wherein the CAM is implemented as a cascaded multi-stage flop-based memory.

* * * * *